Nov. 6, 1956 F. R. STANSEL 2,769,908
NEGATIVE IMPEDANCE TRANSISTOR CIRCUITS
Filed Nov. 22, 1952 2 Sheets-Sheet 1

INVENTOR
F. R. STANSEL
BY R. B. Ardis
AGENT

INVENTOR
F. R. STANSEL
BY R. B. Ardis
AGENT

United States Patent Office 2,769,908

Patented Nov. 6, 1956

2,769,908

NEGATIVE IMPEDANCE TRANSISTOR CIRCUITS

Frank R. Stansel, Millburn, N. J., assignor to Bell Telephone Laboratories, Incorporated, New York, N. Y., a corporation of New York Application November 22, 1952, Serial No. 322,109

14 Claims. (Cl. 250—36)

This invention relates generally to negative impedance transistor circuits and more particularly to grounded-collector negative impedance transistor circuits employing transistors with current amplification factors of less than unity.

In the past, negative impedance devices have been found useful for many purposes in the field of electrical communication. For example, negative resistances have been used to reduce the attenuation in an electrical signal transmission line, to generate the carrier frequency oscillations used in a number of forms of electrical signal transmission, and to improve the "Q" of a tuned circuit, while negative capacities have been used for such purposes as varying the resonant frequency of a tuned circuit. A number of negative impedance vacuum tube circuits are well known, and recently a number of negative impedance circuits have been developed which use some of the characteristics of transistors to considerable advantage. Several negative resistance transistor circuits are shown, for example, in United States Patent 2,585,078, issued February 12, 1952, to H. L. Barney.

Previously known negative impedance transistor circuits, such as the negative resistance circuits disclosed in the Barney patent, are, however, based upon transistors of the so-called point-contact type (disclosed, for example, in the article "Some circuit aspects of the transistor," by R. M. Ryder and R. J. Kircher, appearing at page 367 of the July 1949 issue of The Bell System Technical Journal). Such transistors generally have a current amplification factor ($\alpha$) greater than unity and circuits utilizing them can easily be made to exhibit negative input resistances through the proper selection of external resistances. A different problem exists, however, in the case of transistors of the junction type (disclosed, for example, in the article "Some circuit properties and applications of n-p-n transistors," by R. L. Wallace, Jr., and W. J. Pietenpol, appearing at page 530 of the July 1951 issue of The Bell System Technical Journal) and any other transistors which have values of $\alpha$ less than unity. In the past, it generally has not been found possible to make such transistors exhibit negative input impedances.

A principal object of the present invention is, therefore, to secure a negative input impedance from a circuit using a transistor having a current amplification factor of less than unity.

Another object is to secure negative input impedances from such transistor circuits in as simple a manner as possible.

In its principal aspect, the present invention takes the form of a two-terminal transistor circuit of the so-called grounded-collector configuration in which a load capacity is connected in parallel with a load resistance in order to produce a negative input impedance. If the elements are properly proportioned, in a manner which will be described, the circuit will be made to exhibit a negative input impedance regardless of the fact that the transistor may have a value of $\alpha$ less than unity.

The grounded-collector transistor circuit is a bidirectional device, i. e., it is capable of transmitting signals in either of two directions. As a two-terminal negative impedance, therefore, such a circuit may have either the transistor base or the transistor emitter as one of the two terminals. In embodiments of the invention which have the transistor base as a terminal, the impedance presented by the circuit contains a negative resistance, while in those which use the transistor emitter as a terminal, that impedance contains a negative capacity.

The principles underlying the invention may also be employed to compensate for any decrease in the input resistance of a grounded-collector transistor amplifier with increased signal frequency. A properly proportioned capacitor connected across the load resistance permits such an amplifier to retain its high input resistance even at signal frequencies at which the input resistance would otherwise tend to be reduced.

A more complete understanding of the invention may be obtained from the following detailed description of several specific embodiments. In the drawings.

Figure 1A:
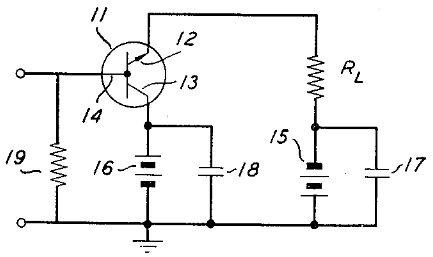
Fig. 1A is a schematic diagram of a grounded-collector transistor circuit in which the base electrode is used as an input terminal.

In Fig. 1A, the grounded-collector circuit illustrated comprises a transistor 11 having an emitter electrode 12, a collector electrode 13, and a base electrode 14, in addition to a load resistance $R_L$ and various means to supply operating potentials to respective transistor electrodes. Input terminals are connected to the base electrode and to ground. In the conventional transistor symbol shown, the emitter is indicated by the arrow, and the direction of positive emitter current flow is indicated by the direction of the arrow. Thus, since its emitter current normally flows away from the base into the emitter electrode, a junction transistor of the n-p-n type is represented by a symbol in which the emitter arrow points away from the base. Conversely, a junction transistor of the p-n-p type is represented by one in which the emitter arrow points toward the base. For convenience in this and succeeding figures, the conventional transistor symbol used has the emitter arrow pointing away from the base, and all battery polarities are chosen for the indicated direction of emitter current flow. The illustrated embodiments of the invention are not, however, limited to one particular type of transistor. For emitter current flow in the opposite direction, all battery polarities are reversed from those shown in the drawings.

In Fig. 1A, the emitter electrode of transistor 11 is biased in the forward direction by a suitable direct voltage source 15 and the collector electrode is biased in the reverse direction by a direct voltage source 16. Sources 15 and 16 are shunted by bypass condensers 17 and 18, respectively, and a resistor 19 is connected between the emitter electrode and ground. Resistor 19 is essentially part of the biasing circuit and serves to complete the direct-current base-collector circuit regardless of the nature of the circuit to which the illustrated input terminals may be connected. It may, of course, be omitted if desired.

If it is desired to make the input resistance of a grounded-collector transistor circuit like that shown in Fig. 1A negative, it is, as pointed out in the above-mentioned Barney patent, only necessary to proportion the ordinary circuit parameters properly if the transistor has a current amplification factor in excess of unity. However, the circuit shown in Fig. 1A cannot be made to exhibit a negative input resistance if a transistor, such as a junction transistor, which has a value of $\alpha$ of less than unity, is used. This may readily be shown both experimentally and by a mathematical analysis of the equivalent circuit shown in Fig. 1B.

Figure 1B:
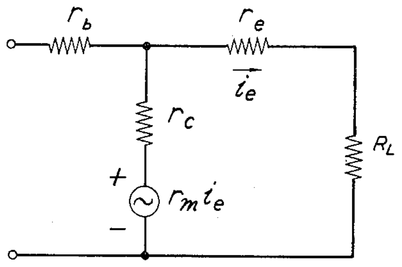
Fig. 1B is an equivalent circuit of the circuit shown in Fig. 1A.

In Fig. 1B, transistor 11 is represented by an equivalent T network consisting of the internal emitter, collector, and base resistances $r_e$, $r_c$, and $r_b$ and an equivalent generator $r_m i_e$. In this latter representation, $r_m$ is the so-called mutual resistance of the transistor and $i_e$ is the emitter current. Since the circuit is to be analyzed from the alternating-current standpoint only, all biasing and bypass elements are omitted from the equivalent circuit.

As given in equation 52 of the above-mentioned article by Wallace and Pietenpol, the input resistance of a grounded-collector transistor circuit like that represented by Figs. 1A and 1B is $$R_{in}=r_b+r_c-\frac{r_c(r_c-r_m)}{r_e+r_c-r_m+R_L} \qquad (1)$$

Rearranging terms, $$R_{in}=r_b+\frac{r_c(r_e+R_L)}{(r_e+R_L)+(r_c-r_m)} \qquad (2)$$

or $$R_{in}=r_b+\frac{r_c}{1+\frac{r_c-r_m}{r_e+R_L}} \qquad (3)$$

The current amplification factor of a transistor is known to be given by the equation $$\alpha=\frac{r_m+r_b}{r_c+r_b} \qquad (4)$$

(Equation 3 of the article by Wallace and Pietenpol). From (4), one may obtain a value of $$r_c-r_m$$

which when substituted in (3) gives $$R_{in}=r_b+\frac{r_c}{1+\frac{(r_c+r_b)(1-\alpha)}{r_e+R_L}} \qquad (5)$$

In general, $r_b<<r_c$ and the initial $r_b$ term in Equation 5 can be neglected, giving $$\frac{R_{in}}{r_c}=\frac{1}{1+\frac{(1-\alpha)r_c}{r_e+R_L}} \qquad (6)$$

and $$\frac{1}{R_{in}}=\frac{1}{r_c}+\frac{(1-\alpha)}{r_e+R_L} \qquad (7)$$

Replacing resistances with conductances for convenience, and letting $r_e<<R_L$, $$G_{in}=g_c+(1-\alpha)G_L \qquad (8)$$

where $G_{in}$, $g_c$, and $G_L$ are the reciprocals of $R_{in}$, $r_c$, and $R_L$, respectively.

D. E. Thomas has found (see, e. g., his application Serial No. 321,435, filed November 19, 1952) that the current amplification factor of most transistors may be represented by the relation $$\alpha=\frac{\alpha_0}{1+j\Omega} \qquad (9)$$

where $\alpha_0$ is the low frequency value of $\alpha$, $\Omega$ is the ratio $$\frac{f}{f_c}$$

$f$ represents frequency, and $f_c$ represents the transistor $\alpha$ cut-off frequency. In a transistor having such a frequency characteristic, $\alpha$ is substantially constant at low frequencies and decreases with frequency thereafter. The cut-off frequency $f_c$ is defined as the frequency at which $\alpha$ is down to $1/\sqrt{2}$ of its low frequency value. Substituting the value for $\alpha$ given by (9) into Equation 8 introduces the effect of the variation of $\alpha$ with frequency and gives the following equation for the input admittance $Y_{in}$:

$$Y_{in}=g_c+G_L\frac{(1-\alpha_o)+\Omega^2}{1+\Omega^2}+j\frac{\alpha_o\Omega G_L}{1+\Omega^2} \qquad (10)$$

The real part of Equation 10 represents the more exact expression for input conductance and is as follows:

$$G_{in}=g_c+G_L\left[\frac{(1-\alpha_o)+\Omega^2}{1+\Omega^2}\right] \qquad (11)$$

If it is desired to make the input conductance, and hence the input resistance, of such a circuit negative, it is necessary to make the $G_L$ term on the right-hand side of Equation 11 negative and greater than $g_c$. That, it will be noted, is possible only if $\alpha_0$, the low frequency value of $\alpha$, is greater than unity. Since the current amplifiction factor of a junction transistor is less than unity, the input resistance of the circuit represented in Figs. 1A and 1B cannot be made negative if such a transistor is used. The same conclusion holds, of course, if any other type of transistor having a value of $\alpha$ of less than unity is used.

Since transistors of the junction type have certain advantages over those of the point-contact type, including lower voltage and power requirements as well as smaller size, it is desirable to have a negative resistance circuit in which they may be used and their advantages secured. The embodiment of the invention illustrated schematically in Fig. 2A is such a circuit.

Figure 2A:
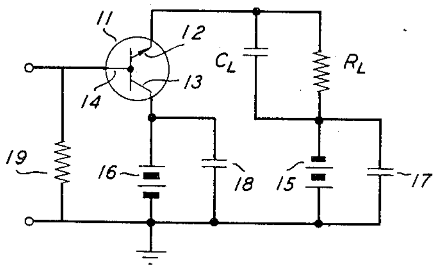
Fig. 2A is a schematic diagram of an embodiment of the present invention in the form of a two-terminal negative resistance.

The embodiment of the invention shown in Fig. 2A is the same as the grounded-collector transistor circuit shown in Fig. 1A, with the exception that a capacitor $C_L$ has been connected in parallel with the load resistance $R_L$. A capacitor $C_L$ of the proper size makes the input resistance of the circuit negative, and the resulting circuit takes the form of a two-terminal negative resistance which is suitable for application wherever a two-terminal negative resistance may be required.

Figure 2B:
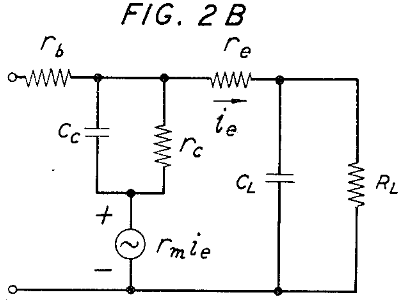
Fig. 2B is an equivalent circuit of the circuit shown in Fig. 2A.

The equivalent circuit of the embodiment of the invention shown in Fig. 2A is given in Fig. 2B. There, as in Fig. 1B, the transistor is represented by an equivalent T network composed of the internal transistor emitter, collector, and base resistances $r_e$, $r_c$, and $r_b$ and the equivalent generator $r_m i_e$. As stated previously, $r_m$ is the so-called mutual resistance of the transistor and $i_e$ is the emitter current. Load resistance $R_L$ and capacitor $C_L$ are included directly in the equivalent circuit in their original form.

The mathematical analysis of Fig. 2B is substantially the same as that of Fig. 1B and, in order to get an expression for input admittance directly, $G_L$ in Equation 10 is replaced with $$G_L+j2\pi fC_L$$

since the capacity $C_L$ is in parallel with the conductance $G_L$.

The input admittance of Fig. 2B is $$Y_{in}=G_{in}+j2\pi fC_{in} \qquad (12)$$

where $C_{in}$ is the capacitive component of the input admittance $Y_{in}$. Assuming the collector conductance $g_c$ to have a capacity $c_c$ in parallel with it (shown in Fig. 2B), the capacitive component of $Y_{in}$ in Fig. 2B can be shown to have a term $c_c$ in addition to the imaginary term in Equation 10. Replacing $G_L$ in Equation 10 with $$G_L+j2\pi fC_L$$

and including a $c_c$ term in the expression for capacity, the expressions for input conductance and capacity in Fig. 2B become:

$$G_{in}=g_c+G_L\left[\frac{(1-\alpha_0)+\Omega^2}{1+\Omega^2}\right]-2\pi f_c C_L\alpha_0\left[\frac{\Omega^2}{1+\Omega^2}\right] \quad (13)$$

and $$C_{in}=c_c+C_L\left[\frac{(1-\alpha_0)+\Omega^2}{1+\Omega^2}\right]+\frac{\alpha_0 G_L}{2\pi f_c(1+\Omega^2)} \quad (14)$$

The third term in Equation 13 gives the effect on the input conductance of the load capacitance $C_L$. This term has a negative sign and, therefore, decreases the input conductance, i. e., increases the input resistance. If it is larger than the algebraic sum of the $g_c$ and $G_L$ terms of Equation 13, the input conductance, and hence the input resistance, of the circuit will be negative, regardless of the fact that the $\alpha_0$ of the transistor may be less than unity. Even if $\alpha_0$ is greater than unity, the presence of $C_L$ gives increased control over input conductance and $G_{in}$ can be made negative thereby even if, by itself, the $G_L$ term in Equation 13 does not exceed the $g_c$ term.

The value of $C_L$, in terms of other circuit and transistor constants, which will yield a negative input conductance in the embodiment of the invention shown in Figs. 2A and 2B, may be obtained by setting $G_{in}$ in Equation 13 equal to zero and solving for $C_L$. A value of $C_L$ greater than the amount obtained by setting $G_{in}$ equal to zero gives a negative conductance. In other words, the criterion for a negative input conductance (and resistance) is:

$$C_L>\frac{g_c(1+\Omega^2)+G_L(1-\alpha_0+\Omega^2)}{2\pi f_c\alpha_0\Omega^2} \quad (15)$$

Figure 3:
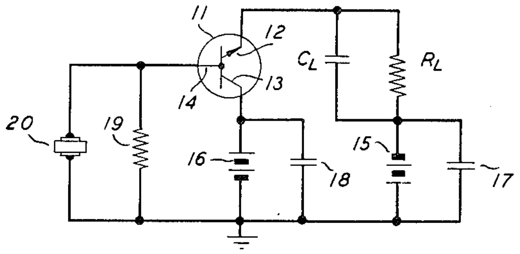
Fig. 3 is a schematic diagram of a negative resistance piezoelectric oscillator embodying the present invention.

An embodiment of the invention utilizing the negative resistance properties made available from a junction transistor in a piezoelectric oscillator is shown schematically in Fig. 3. The negative resistance oscillator shown in Fig. 3 is the same as the two-terminal negative resistance shown in Fig. 2A, except that a piezoelectric crystal 20 is connected between two terminals of the negative resistance in parallel with resistor 19.

In Fig. 3, the load capacitor $C_L$ is adjusted to satisfy Relation 15, making the input conductance of the transistor negative. Crystal 20 acts essentially like a highly selective series resonant circuit in series with a resistance. In operation, oscillations build up in amplitude until the negative resistance equals the positive resistance of the crystal, at which point stable operation is obtained.

The oscillator shown in Fig. 3 has been found to operate satisfactorily with transistors having a much wider range of parameters than do most of the circuits found in the prior art. For example, two n-p-n transistors which have given satisfactory results in the circuit of Fig. 3 had an $\alpha$ of 0.927 and an $r_c$ of 0.21 megohm and an $\alpha$ of 0.825 and an $r_c$ of 0.72 megohm, respectively. In the operation of the circuit, it is possible, if desired, to omit either the collector battery 16 or the emitter battery 15 and operate from one source of power only. Also, resistor 19 may be replaced by a choke coil, and it has been found that the addition of a small condenser between the emitter and base of transistor 11 will increase the amplitude of oscillation.

Figure 4:
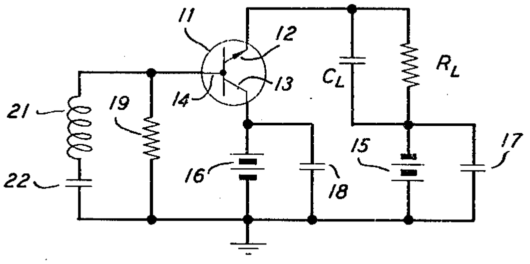
Fig. 4 is a schematic diagram of another negative resistance oscillator embodying the invention.

The negative resistance oscillator illustrated in Fig. 4 is substantially the same as the piezoelectric oscillator in Fig. 3, with the exception that a series resonant circuit comprising an inductor 21 and a capacitor 22 is connected between the base electrode of transistor 11 and ground in place of crystal 20. The series resonant circuit constitutes a frequency-determining impedance and the oscillator operates in substantially the same manner as the one in Fig. 3.

Figure 5A:
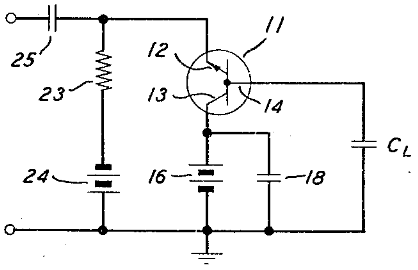
Fig. 5A is a schematic diagram of a grounded-collector transistor circuit in which the emitter electrode is used as an input terminal.

The grounded-collector transistor circuit shown schematically in Fig. 5A resembles the one in Fig. 1A in many respects, the principal difference being that in Fig. 5A the input terminals are connected to the transistor emitter and ground, whereas in Fig. 1A they are connected to the base and ground. The direction of signal transmission is, in other words, reversed. In addition, the circuit is provided with a load capacity rather than a load resistance. In Fig. 5A, a load capacity $C_L$ is connected between the base electrode of transistor 11 and ground. To complete the direct-current bias circuit between the base and collector electrodes, it generally is desirable to include a high resistance or reactance shunt path across $C_L$. However, this generally is made a high enough impedance so that its effect on the alternating-current operation of the circuit is negligible and it need not be considered in the analysis which follows.

The collector electrode of transistor 11 is biased in the reverse direction by a source of direct voltage 16 and source 16 is, in turn, bypassed to ground by a capacitor 18. The emitter electrode is biased in the forward direction by a direct voltage source 24 which, along with a feed resistor 23, is connected in series between the emitter and ground. A blocking capacitor is connected between the emitter and the associated input terminal.

In Fig. 5A, as in Fig. 1A, one or the other of direct voltage supply sources 16 and 24 may be eliminated if it is so desired. The circuit has been found to operate satisfactorily on one biasing source.

Figure 5B:
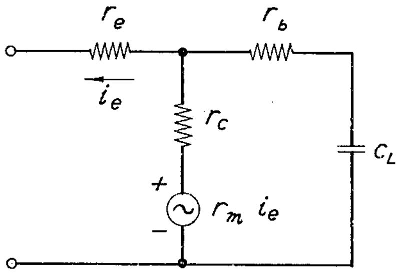
Fig. 5B is an equivalent circuit of the circuit shown in Fig. 5A.

As was the case with Fig. 1A, the analysis of Fig. 5A is simplest if done in connection with an equivalent circuit. Such a circuit is shown in Fig. 5B, which is the same as Fig. 1B except that the input terminals have replaced the load and vice versa. Using methods of analysis like those used in the derivation of Equation 11, the input capacity of the grounded-collector transistor circuit illustrated in Fig. 1A can be shown to be $$C_{in}=(c_c+C_L)\left[\frac{(1-\alpha_0)\Omega^2}{(1-\alpha_0)^2\Omega^2}\right]-\frac{\alpha_0 g_c}{2\pi f_c[(1-\alpha_0)^2+\Omega^2]} \quad (16)$$

From Equation 16, it is evident that the circuit shown in Fig. 5A will exhibit a negative input capacity when $\alpha_0$ is less than unity only if the second term on the right-hand side of 16 is larger than the first term. Since $g_c$ is inherently a small quantity, this generally will not be possible.

Figure 6A:
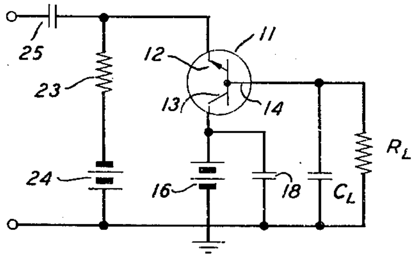
Fig. 6A is a schematic diagram of an embodiment of the invention in the form of a two-terminal negative capacity.

A two-terminal negative capacity embodying the invention is shown in Fig. 6A. The actual circuit arrangement there is the same as in Fig. 5A, except that a resistor, providing a load resistance $R_L$ (having a conductance $G_L$), has been added in parallel with load capacity $C_L$. Proportioned in accordance with the principles of the present invention, load resistance $R_L$ makes the input capacity of the circuit negative, regardless of whether the transistor $\alpha$ is greater or less than unity.

Figure 6B:
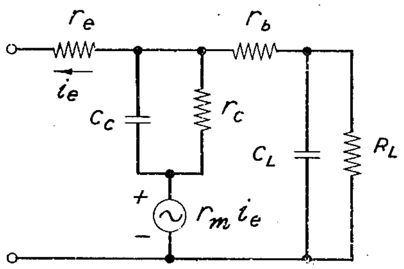
Fig. 6B is an equivalent circuit of the circuit shown in Fig. 6A.

The equivalent circuit of the embodiment of the invention illustrated in Fig. 6A is given in Fig. 6B and is the same as that in Fig. 5B except that resistance $R_L$ is represented and the collector impedance is shown to have a capacitive component $c_c$. Analysis similar to that used in deriving Equations 13 and 14 can be shown to yield the following expressions for input capacity and input conductance:

$$C_{in}=(c_c+C_L)\left[\frac{(1-\alpha_0)+\Omega^2}{(1-\alpha_0)^2+\Omega^2}\right]-\frac{\alpha_0(g_c+G_L)}{2\pi f_c[(1-\alpha_0)^2+\Omega^2]} \quad (17)$$

and $$G_{in}=\frac{(1-\alpha_0+\Omega^2)(g_c+G_L)+2\pi f_c\Omega^2\alpha_0(c_c+C_L)}{(1-\alpha_0)^2+\Omega^2} \quad (18)$$

The second term in Equation 17 gives the effect of the load conductance $G_L$ on the input capacity. Since it has a negative sign, it has the effect of decreasing the input capacity of the circuit. If it is larger than the first term of Equation 17, the input capacity will be negative, even though the $\alpha_0$ of the transistor may be less than unity. If $\alpha_0$ is greater than unity, the $G_L$ term may, of course, be relied upon to make $C_{in}$ more negative than it would be in its absence.

The value of $G_L$, in terms of the other circuit and transistor parameters, which will yield a negative input capacity in the embodiment of the invention illustrated schematically in Fig. 6A is obtained by setting $C_{in}$ in Equation 17 equal to zero and solving for $G_L$. A value of $G_L$ greater than that so obtained yields a negative input capacity. Thus, the criterion for a negative input capacity in Fig. 6A is:

$$G_L>\frac{2\pi f_c}{\alpha_0}(c_c+C_L)(1-\alpha_0+\Omega^2)-g_c \quad (19)$$

The principles of the present invention may also be used to advantage in grounded-collector transistor amplifiers to compensate for the decrease in input resistance with frequency. Equation 10 illustrates the increase of the input conductance of the grounded-collector transistor circuit of Fig. 1A with frequency. Since the input conductance increases with frequency, the input resistance undergoes a decrease. If the amplifier is used to couple a high impedance generator to a low impedance load, such a decrease in input resistance may be objectionable. To overcome this decrease, a compensating capacitor may, in accordance with a feature of the invention, be connected in parallel with the load resistance. Equation 13 shows the variation of the input conductance of a grounded-collector circuit like that of Fig. 2A, which has a capacitor $C_L$ connected in parallel with the load resistance $R_L$, with frequency. For this purpose, it may be assumed that Fig. 2A illustrates a grounded-collector transistor amplifier, with load resistance $R_L$ representing the output circuit and useful load of the device. As has already been pointed out, the presence of $C_L$ has the effect of decreasing the input conductance of the circuit, and hence of increasing its input resistance. Capacitor $C_L$ can therefore be selected to give the desired degree of compensation. This latter feature of the invention applies, moreover, to circuits utilizing transistors having values of $\alpha$ in excess of one as well as to those using transistors having values of $\alpha$ less than unity, since all undergo input resistance changes of a similar nature with increased signal frequency.

It is to be understood that the above-described arrangements are illustrative of the application of the principles of the invention. Numerous other arrangements may be devised by those skilled in the art without departing from the spirit and scope of the invention.

What is claimed is:

1. In combination, a transistor having emitter, collector, and base electrodes and a current amplification factor less than unity, at least one source of direct voltage connected to supply operating potentials to said electrodes, a signal input path for said transistor coupled between said collector electrode and a first of the other of said electrodes, a signal output path for said transistor coupled between said collector electrode and the second of the other of said electrodes, said collector electrode being common to said signal input and output paths, and means to produce a negative input impedance in said signal input path between said collector electrode and said first electrode which comprises a load resistance and a load capacity connected in parallel between said collector electrode and said second electrode in the portion of said signal output path not common to said signal input path.

2. A transistor network of the grounded-collector configuration having a single pair of accessible terminals which comprises a junction transistor having emitter, collector, and base electrodes, at least one source of direct voltage connected to supply operating potentials to said electrodes, a connection between one of said terminals and said collector electrode, a connection between the other of said terminals and one of the other said electrodes, and means to produce a negative input impedance between said terminals which comprises a load resistance and a load capacity connected in parallel between said collector electrode and the remaining one of said electrodes.

3. In combination, a transistor having emitter, collector, and base electrodes and a current amplification factor less than unity, at least one source of direct voltage connected to supply operating potentials to said electrodes, a signal input path for said transistor coupled between said base and collector electrodes, a signal output path for said transistor coupled between said collector and emitter electrodes, said collector electrode being common to said signal input and output paths, a load resistance connected between said emitter and collector electrodes in the portion of said signal output path not common to said signal input path, and means to produce a negative input resistance in said signal input path between said base and collector electrodes which comprises a capacitor connected in parallel with said load resistance.

4. In combination, a transistor having emitter, collector, and base electrodes and a current amplification factor less than unity, at least one source of direct voltage connected to supply operating potentials to said electrodes, a signal input path for said transistor coupled between said base and collector electrodes, a signal output path for said transistor coupled between said collector and emitter electrodes, said collector electrode being common to said signal input and output paths, a load resistance connected between said emitter and collector electrodes in the portion of said signal output path not common to said signal input path, and means to produce a negative input resistance in said signal input path between said base and collector electrodes which comprises a capacitor connected in parallel with said load resistance, said capacitor being proportioned in accordance with the relation $$C_L>\frac{g_c(1+\Omega^2)+G_L(1-\alpha_0+\Omega^2)}{2\pi f_c\alpha_0\Omega^2}$$

where $C_L$ is the capacity of said capacitor, $g_c$ is the internal collector conductance of said transistor, $G_L$ is the conductance of said load resistance, $\alpha_0$ is the low frequency value of the current amplification factor $\alpha$ of said transistor, $\Omega$ is the ratio of $f$ to $f_c$, $f$ represents frequency, and $f_c$ is the transistor $\alpha$ cut-off frequency.

5. A transistor network of the grounded-collector configuration having emitter, collector, and base electrodes, at least one source of direct voltage connected to supply operating potentials to said electrodes, a connection between one of said terminals and said base electrode, a connection between the other of said terminals and said collector electrode, a load resistance connected between said emitter and collector electrodes, and means to produce a negative input resistance between said terminals which comprises a capacitor connected in parallel with said load resistance.

6. A transistor network of the grounded-collector configuration having a single pair of accessible terminals which comprises a junction transistor having emitter, collector, and base electrodes, at least one source of direct voltage connected to supply operating potentials to said electrodes, a connection between one of said terminals and said base electrode, a connection between the other of said terminals and said collector electrode, a load resistance connected between said emitter and collector electrodes, and means to produce a negative input resistance between said terminals which comprises a capacitor connected in parallel with said load resistance, said capacitor being proportioned in accordance with the relation $$C_L > \frac{g_c(1+\Omega^2)+G_L(1-\alpha_0+\Omega^2)}{2\pi f_c\alpha_0\Omega^2}$$

where $C_L$ is the capacity of said capacitor, $g_c$ is the internal collector conductance of said transistor, $G_L$ is the conductance of said load resistance, $\alpha_0$ is the low frequency value of the current amplification factor $\alpha$ of said transistor, $\Omega$ is the ratio of $f$ to $f_c$, $f$ represents frequency, and $f_c$ is the transistor $\alpha$ cut-off frequency.

7. A negative resistance oscillator which comprises a transistor having emitter, collector, and base electrodes and a current amplification factor less than unity, at least one source of direct voltage to supply operating potentials to said electrodes, a signal input path for said transistor coupled between said base and collector electrodes, a signal output path for said transistor coupled between said emitter and collector electrodes, said collector electrode being common to said signal input and output paths, a load resistance connected between said emitter and collector electrodes in the portion of said signal output path not common to said signal input path, a frequency-determining impedance connected between said base and collector electrodes in the portion of said signal input path not common to said signal output path, and a capacitor connected in parallel with said load resistance.

8. A negative resistance oscillator which comprises a transistor having emitter, collector, and base electrodes, and a current amplification factor less than unity, at least one source of direct voltage connected to supply operating potentials to said electrodes, a signal input path for said transistor coupled between said base and collector electrodes, a signal output path for said transistor coupled between said emitter and collector electrodes, said collector electrode being common to said signal input and output paths, a frequency-determining impedance connected between said base and collector electrodes in the portion of said signal input path not common to said signal output path, a load resistance connected between said emitter and collector electrodes in the portion of said signal output path not common to said signal input path, and a capacitor connected in parallel with said load resistance, said capacitor being proportioned in accordance with the relation $$C_L > \frac{g_c(1+\Omega^2)+G_L(1-\alpha_0+\Omega^2)}{2\pi f_c\alpha_0\Omega^2}$$

where $C_L$ is the capacity of said capacitor, $g_c$ is the internal collector conductance of said transistor, $G_L$ is the conductance of said load resistance, $\alpha_0$ is the low frequency value of the current amplification factor of said transistor, $\Omega$ is the ratio of $f$ to $f_c$, $f$ represents frequency, and $f_c$ is the transistor $\alpha$ cut-off frequency.

9. A negative resistance oscillator which comprises a transistor having emitter, collector, and base electrodes and a current amplification factor less than unity, at least one source of direct voltage connected to supply operating potentials to said electrodes, a signal input path for said transistor coupled between said base and collector electrodes, a signal output path for said transistor coupled between said emitter and collector electrodes, said collector electrode being common to said signal input and output paths, a piezoelectric crystal connected between said base and collector electrodes in the portion of said signal input path not common to said signal output path, a load resistance connected between said emitter and collector electrodes in the portion of said signal output path not common to said signal input path, and a capacitor connected in parallel with said load resistance, said capacitor being proportioned in accordance with the relation $$C_L > \frac{g_c(1+\Omega^2)+G_L(1-\alpha^0+\Omega^2)}{2\pi f_c\alpha_0\Omega^2}$$

where $C_L$ is the capacity of said capacitor, $g_c$ is the internal collector conductance of said transistor, $G_L$ is the conductance of said load resistance, $\alpha_0$ is the low frequency value of the current amplification factor $\alpha$ of said transistor, $\Omega$ is the ratio of $f$ to $f_c$, $f$ represents frequency, and $f_c$ is the transistor $\alpha$ cut-off frequency.

10. In combination, a transistor having emitter, collector, and base electrodes and a current amplification factor less than unity, at least one source of direct voltage connected to supply operating potentials to said electrodes, a signal input path for said transistor coupled between said emitter and collector electrodes, a signal output path for said transistor coupled between said base and collector electrodes, said collector electrode being common to said signal input and output paths, a load capacity connected between said base and collector electrodes in the portion of said signal output path not common to said signal input path, and means to produce a negative input capacity in said signal input path between said emitter and collector electrodes which comprises a resistance connected in parallel with said capacity.

11. In combination, a transistor having emitter, collector, and base electrodes and a current amplification factor less than unity, at least one source of direct voltage connected to supply operating potentials to said electrodes, a signal input path for said transistor coupled between said emitter and collector electrodes, a signal output path for said transistor coupled between said base and collector electrodes, said collector electrode being common to said signal input and output paths, a load capacity connected between said base and collector electrodes in the portion of said signal output path not common to said signal input path, and means to produce a negative input capacity in said signal input path between said emitter and collector electrodes which comprises a resistance connected in parallel with said capacity, said resistance being proportioned in accordance with the relation $$G_L > \frac{2\pi f_c}{\alpha_0}(c_c+C_L)(1-\alpha_0+\Omega^2)-g_c$$

where $G_L$ is the conductance of said resistance, $g_c$ is the internal collector conductance of said transistor, $c_c$ is the internal collector capacity of said transistor, $C_L$ is the load capacity, $\alpha_0$ is the low frequency value of the current amplification factor $\alpha$ of said transistor, $\Omega$ is the ratio of $f$ to $f_c$, $f$ represents frequency, and $f_c$ is the transistor $\alpha$ cut-off frequency.

12. A transistor network of the grounded-collector configuration having a single pair of accessible terminals which comprises a junction transistor having emitter, collector, and base electrodes, at least one source of direct voltage connected to supply operating potentials to said electrodes, a connection between one of said terminals and said emitter electrode, a connection between the other of said terminals and said collector electrode, a load capacity connected between said base and collector electrodes, and means to produce a negative input capacity between said terminals which comprises a resistance connected in parallel with said load capacity.

13. A transistor network of the grounded-collector configuration having a single pair of accessible terminals which comprises a junction transistor having emitter, collector, and base electrodes, at least one source of direct voltage connected to supply operating potentials to said electrodes, a connection between one of said terminals and said emitter electrode, a connection between the other of said terminals and said collector electrode, a load capacity connected between said base and collector electrodes, and means to produce a negative input capacity between said terminals which comprises a resistance connected in parallel with said load capacity, said resistance being proportioned in accordance with the relation.

$$G_L > \frac{2\pi f_c}{\alpha_0}(c_c+C_L)(1-\alpha_0+\Omega^2)-g_c$$

where $G_L$ is the conductance of said resistance, $g_c$ is the internal collector conductance of said transistor, $c_c$ is the internal collector capacity of said transistor, $C_L$ is the load capacity, $\alpha_0$ is the low frequency value of the current amplification factor $\alpha$ of said transistor, $\Omega$ is the ratio of $f$ to $f_c$, $f$ represents frequency, and $f_\alpha$ is the transistor $\alpha$ cut-off frequency.

14. In a transistor circuit of the ground-collector configuration, a transistor having emitter, collector, and base electrodes, at least one source of direct voltage connected to supply operating potentials to said electrodes, a load resistance connected between said emitter and collector electrodes, and means to increase the input resistance appearing between said base and collector electrodes which comprises a capacitor connected in parallel with said load resistance.

References Cited in the file of this patent

UNITED STATES PATENTS

| | | |
|---|---|---|
| 2,012,497 | Clapp | Aug. 27, 1935 |
| 2,029,488 | Koch | Feb. 4, 1936 |
| 2,569,347 | Shockley | Sept. 25, 1951 |
| 2,585,078 | Barney | Feb. 12, 1952 |

OTHER REFERENCES

Article "Junction Transistor Equivalent Circuits and Vacuum Tube Analogy," by Giacoletto, pages 1490–1493, Proc. I. R. E., vol. 40, No. 11, dated November 1952.